United States Patent [19]

Layton

[11] Patent Number: 5,048,201
[45] Date of Patent: Sep. 17, 1991

[54] LAMINAR FLOW SYSTEM FOR DRYING PARTS

[75] Inventor: Howard M. Layton, New Fairfield, Conn.

[73] Assignee: Interlab, Inc., Danbury, Conn.

[21] Appl. No.: 552,165

[22] Filed: Jul. 13, 1990

[51] Int. Cl.$^5$ ............................................. F26B 21/06
[52] U.S. Cl. .......................................... 34/77; 34/80; 34/82; 219/400; 219/347
[58] Field of Search ........................................ 34/72–82, 34/169, 233, 234, 201, 202; 219/400, 360, 370, 373, 406, 369

[56] References Cited

U.S. PATENT DOCUMENTS

| | | | |
|---|---|---|---|
| 3,538,615 | 11/1970 | Fuhring et al. | 34/74 |
| 3,650,040 | 3/1972 | Statham et al. | 34/80 |
| 3,652,825 | 3/1972 | Layton | 219/400 |
| 3,875,683 | 4/1975 | Waters | 34/169 |
| 4,656,757 | 4/1987 | Oschmann | 34/80 |

Primary Examiner—James C. Yeung
Attorney, Agent, or Firm—Michael Ebert

[57] ABSTRACT

A system for drying microelectronic, optical and other parts that in the course of their processing are rendered wet with solvents or other liquids, which if not fully evaporated from the parts will contaminate and impair their quality. The system includes an open-ended drying chamber having a work zone intermediate its sides in which the parts to be dried are supported for exposure to a gas stream. One end of the chamber defines a gas inlet to admit the gas stream which sweeps the entire chamber. Coupled to the drying chamber is a pressure chamber in which a submicron particle filter unit of the Hepa type producing a relatively low pressure drop is disposed to cover the gas inlet. Gas fed into the pressure chamber and heated to an elevated temperature imposes a distributed pressure on the entry face of the filter unit and passes therethrough to yield at its exit face a laminar stream of hot gas that subjects the parts in the work zone to a substantially uniform drying action, so that all parts being treated are fully dried.

9 Claims, 1 Drawing Sheet

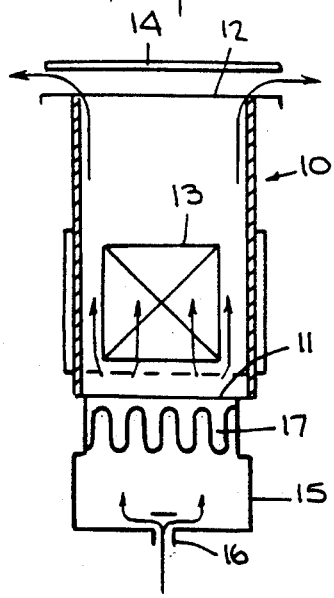
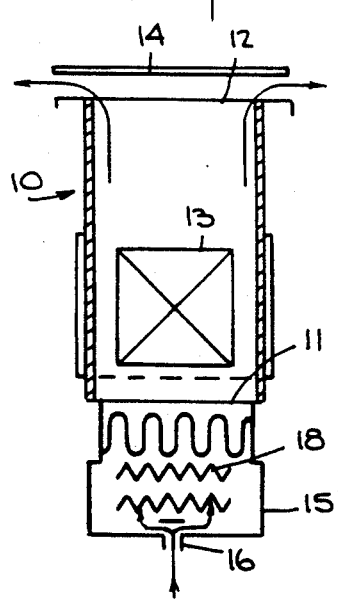
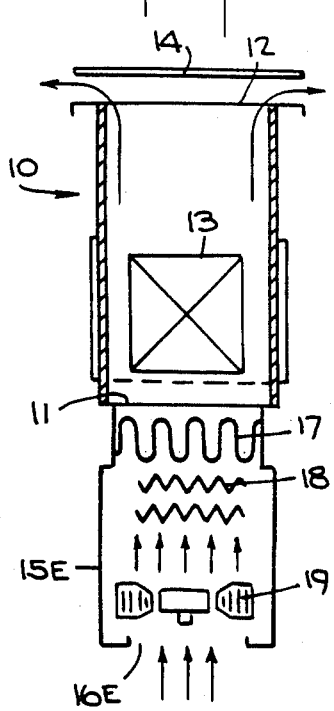
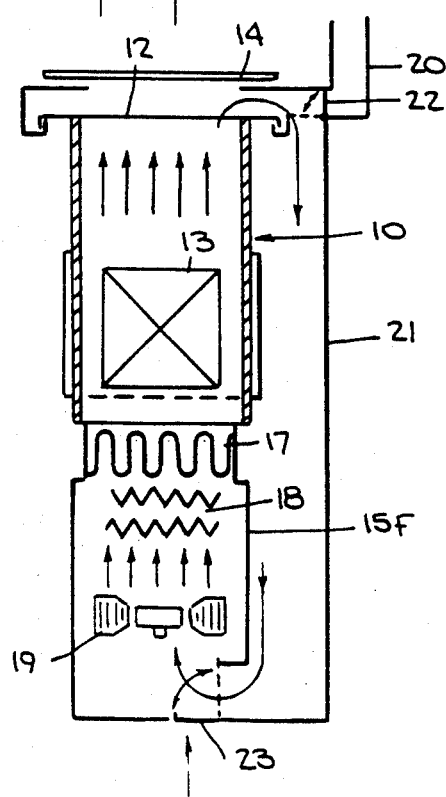
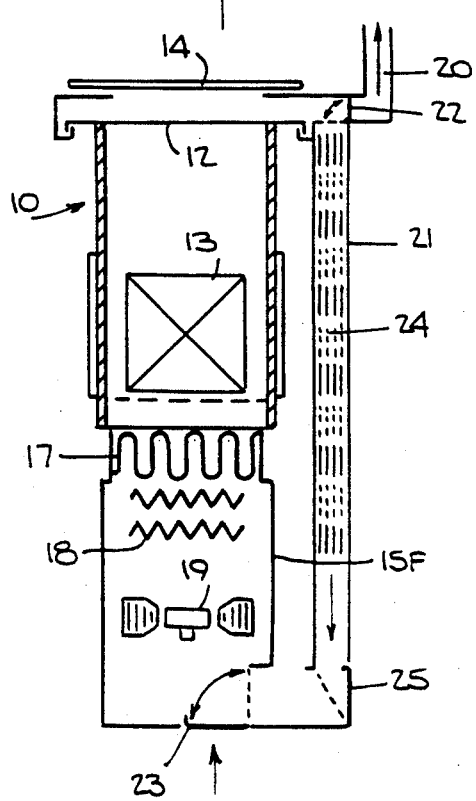

LAMINAR FLOW SYSTEM FOR DRYING PARTS

BACKGROUND OF INVENTION

1. Field of Invention

This invention relates generally to systems for drying microelectronic optical and other parts which in the course of their processing are rendered wet with solvents or other liquids, and more particularly to a system in which the parts to be dried are subjected to a laminar flow of heated gas which promotes uniform evaporative drying of the parts.

2. Status of Prior Art

In critical parts drying systems of the type currently in use in fabricating integrated circuit silicon wafers and other microelectronic devices, in order to achieve optimum cleanliness and a high yield of uncontaminated parts, it is vital that the wet parts be subjected to uniform treatment throughout the work zone of the drying chamber or vessel.

Thus if the parts to be dried are supported within a chamber into which is fed a heated gas to promote evaporative drying, and no means are included to govern or direct the flow of gas, the gas will then flow in a direct line stream extending from the inlet. As a consequence, relatively stagnant pockets of gas will develop in those regions of the chamber which are displaced from the gas stream, and not all of these parts will be adequately dried. Because some of the parts remain contaminated by residual solvents or other liquids, their quality is impaired.

With a view to producing more satisfactory gas flow patterns in a critical parts drying system, it is known to use for this purpose flow diffusers such as perforated screens, baffles, and other expedients to modify or split up the gas stream to create a desirable flow pattern. However, the stringent demands now imposed on process control in microelectronics technology are such that deflectors and other means for modifying gas flow are inadequate, and satisfactory drying results are not realized.

In order to overcome this drawback, my prior U.S. Pat. No. 3,543,776 (Layton) discloses a drying vessel in which the parts to be dried in a work zone are subjected to the flow of a heated inert gas such as nitrogen. The arrangement is such that the gas flow pattern is laminar, thereby effecting a uniform and efficient drying action.

To this end, my prior patent feeds the incoming gas into a pressure chamber disposed below the work zone in the vessel, the chamber being covered by a porous membrane. Under this membrane is a diffuser screen which prevents the gas from directly striking the membrane. As a result, the incoming gas which fills the chamber filters through the membrane into the work zone thereabove in the drying vessel, the membrane producing a pressure differential and hence laminar flow in the work zone.

In practice, the membrane used to establish a laminar flow of nitrogen has a limited ability to serve as an effective particulate filter except for very small gas flow rates. The reason for this limitation is that in all but the smallest pressure chambers, it is necessary that the membrane have a fairly large pore size, otherwise one runs the risk of membrane rupture. To make possible greater flow rates without damaging the membrane, carefully designed membrane supports are provided to this end. But, in general, it was found necessary to augment gas filtration with an auxiliary submicron filter in the gas supply line in all but laboratory scale versions of the drying chamber.

In large commercial scale drying systems of the same type, the pressure chamber below the work zone in the drying vessel was often found to be a source of excessive noise. This noise tended to increase in intensity when the pore size of the membrane was small enough to serve as an effective particulate filter.

The need to use an auxiliary in-line submicron filter did not impose serious limitations on the utility of the evaporative drying chamber until the disadvantages of solvent drying and the environmental problems created thereby led to a growing interest in the use of evaporative drying in areas other than semiconductor and integrated-circuit processing, by means of purified air instead of nitrogen. Thus the precision optics industry and even the eyeglass lens processing industry are at present actively engaged in replacing existing hydrocarbon and fluorocarbon solvent drying systems with other available and cost effective methods.

Though a laminar flow drying chamber of the type disclosed in my prior patent is suitable for those applications entailing the drying of parts other than microelectronic devices, in many cases the cost of nitrogen or even of compressed and purified air has been found in this context to be prohibitive.

SUMMARY OF INVENTION

In view of the foregoing, the main object of this invention is to provide a parts drying system in which the parts to be dried are subjected to a laminar flow stream created by a high-efficiency particulate air filter unit of the Hepa type.

A significant advantage of the invention is that it preserves the concept of laminar gas flow within the drying chamber, as set out in my prior patent, while simultaneously ensuring point-of-use submicron filtration with minimal pressure drop. As a consequence, one may use a low-pressure blower to draw in environmental room air, rather than more costly purified compressed air or dry nitrogen.

It is also an object of this invention to provide a drying system of the above type which includes a Hepa-type filter unit operable at elevated temperature levels whereby the gas fed through the unit into the drying chamber in which the parts to be dried are exposed, may be heated to an elevated temperature upstream of the unit before passing therethrough.

A significant advantage gained by pre-heating the gas, as distinguished from conventional drying arrangements in which a heating assembly is placed downstream of the filter unit is that scale or oxidation products produced in the downstream assembly are not filtered out and therefore contaminate the parts being dried, whereas in the present upstream arrangement, the particulate matter, whether borne by the incoming gas or originating at the heater assembly, is excluded from the drying chamber.

Yet another object of the invention is to provide a system for drying parts in which heated air or nitrogen gas used to effect evaporative drying of the parts may be recirculated and reused to conserve thermal energy in an arrangement in which the incoming gas is heated before passing through the Hepa filter unit.

Briefly stated, these objects are attained in a system for drying microelectronic, optical and other parts that are rendered wet in the course of processing with solvents or other liquids, which if not fully evaporated from the parts will contaminate and impair their quality. The system includes an open-ended drying chamber having a work zone intermediate its sides in which the parts to be dried are supported for exposure to a gas stream. One end of the chamber defines a gas inlet to admit the gas stream which sweeps the entire chamber.

Coupled to the drying chamber is a pressure chamber in which a submicron particle filter unit of the Hepa type producing a relatively low pressure drop is disposed to cover the gas inlet. Gas fed into the pressure chamber and heated to an elevated temperature imposes a distributed pressure on the entry face of the filter unit and passes therethrough to yield at its exit face a laminar stream of hot gas that subjects the parts in the work zone to a substantially uniform drying action, so that all parts being treated are fully dried.

BRIEF DESCRIPTION OF DRAWINGS

For a better understanding of the invention as well as other objects and further features thereof, reference is made to the following detailed description to be read in conjunction with the accompanying drawings, wherein:

FIG. 1 schematically illustrates a single-pass air or nitrogen drying system for use with an external heater assembly;

FIG. 2 shows a single-pass system with an internal heater assembly;

FIG. 3 shows a single-pass drying system, using room air;

FIG. 4 shows a recirculating drying system; and

FIG. 5 shows a recirculating drying system which includes a dessicant bed to remove moisture from the recirculated gas.

DESCRIPTION OF INVENTION

First Embodiment

FIG. 1 shows a single-pass air or nitrogen drying system in accordance with a first embodiment of the invention. The system includes an open-ended drying chamber 10 having a rectangular cross section, the lower end defining a gas inlet 11 and the upper end defining a gas outlet 12.

Disposed within drying chamber 20 intermediate its side walls is a work zone 13 in which the parts to be dried are supported. Because of this arrangement, and as indicated by the flow arrows, gas is free to flow through and around work zone 13 from inlet 11 to outlet 12 where the gas discharged from the chamber is intercepted by a baffle 14 spaced from the upper end of the chamber. As a result, the discharged gas is deflected outwardly by the baffle.

Coupled to the lower end of drying chamber 10 is a pressure chamber 15 having at its base an input port 16 into which heated air or nitrogen is fed. Mounted at the upper end of pressure chamber 15 is a box-like Hepa filter unit which covers inlet 11 of the drying chamber and therefore acts to intercept the air or nitrogen before the gas is permitted to pass into the drying chamber.

A preferred form of Hepa filter unit is one composed of a continuous sheet of non-woven, non-combustible microglass fibers having high tensile strength and water-repellent properties. This non-woven sheet is accordion-folded over narrow fluted corrugated aluminum separators supported within a frame and bonded thereto by sealants. Also provided are gaskets on either face of the frame to form a leak proof seal at the air exit and entry faces of the filter unit.

A commercial Hepa filter unit of this type is available commercially under the trademark MICROFLOW filter from the High Efficiency Filter Corp. of Eatontown, N.J. While a standard Hepa filter unit can withstand temperatures as high as 220° F., in the context of the present invention in which the air or nitrogen gas is heated to as high as 200° C. in order to promote rapid evaporation, it is essential that the Hepa filter unit be capable of functioning at elevated temperatures. To this end, the unit is provided with sealants, gaskets and frames fabricated of materials capable of withstanding the elevated temperatures.

Because pressure chamber 15 is enclosed by Hepa filter unit 17, gas admitted into this chamber through input port 16 fills this chamber and uniformly subjects the entry face of the unit to distributed pressure. The gas which is heated to an elevated temperature by a heater assembly external to the gas input port passes through the Hepa filter unit which acts to filter out not only particles borne by the gas but also scale and oxidation particles originating at the heater assembly.

The heated gas emerges from the exit face of the filter unit as a laminar stream which flows through the drying chamber from inlet 11 to outlet 12 thereof, and in doing so promotes uniform evaporative drying of the parts supported in work zone 13. Because the filter unit extends between the walls of the chamber, no stagnant pockets of gas are developed in the chamber.

Second Embodiment

As shown in FIG. 2 of the drawing, the second embodiment of an air or nitrogen drying system in accordance with the invention includes a drying chamber 10 and a pressure chamber 12, as well as all other elements of the system shown in FIG. 1.

However, in this second embodiment, instead of a heater assembly which is external to pressure chamber 15, an internal heater assembly 18 is provided formed by an array of electrical resistance elements. This assembly is supported within pressure chamber 15 below the high-temperature Hepa filter unit 17.

Thus in this arrangement, the relatively cool air or nitrogen fed into pressure chamber 15 through input port 16 is heated within the confines of the pressure chamber before the gas passes through the filter unit.

Third Embodiment

Because a Hepa-type filter unit produces a low pressure drop as compared to other types of submicron particle filters, this in turn makes it possible to use a low-pressure blower to draw environmental room air into the pressure chamber, rather than make use of compressed purified air or dry nitrogen as the evaporative agent. It is to be borne in mind that in drying parts, the rapidity at which liquid is evaporated from the parts depends on the temperature imparted to the liquid by the heated gas flowing over the liquid surface and the rate of such flow. Hence the higher the temperature of the gas and the greater its flow rate, the more rapid and efficient is the drying process.

In the embodiment shown in FIG. 3, the system is essentially the same as that shown in FIG. 2, but an enlarged pressure chamber 15E is provided to accommodate, in addition to Hepa filter unit 17 and heater assembly 18, a low-pressure air blower 19. This blower is interposed between an enlarged input port 16E at the base of the pressure chamber 15E and the heater assembly 18.

Thus in the third embodiment, the system is self-sufficient and acts to draw ambient air into the pressure chamber, and to heat this air to an elevated temperature before it passes through the Hepa filter unit.

Fourth Embodiment

In the drying system shown in FIG. 3, the heated air which carries the vapor evaporated from the parts discharged from the outlet 12 of the drying chamber and then wasted; hence what is always fed into input port 16E of the pressure chamber is relatively cool room air which must then be heated.

To conserve thermal energy, in the embodiment of the system shown in FIG. 4, exhaust and inlet gates are provided in conjunction with a system of the type shown in FIG. 3. These gates permit operation either in a "recirculating mode" in which the heated air discharged from drying chamber 10 is fed back to the gas input of a pressure chamber 15F, which houses blower 19 and heater assembly 18, or in a "flow-through mode" in which the gas discharged from drying chamber 10 is directed to an exhaust duct 20.

In the FIG. 4 embodiment, also provided is a gas return duct 21, as well as an exhaust gate 22 which when closed, as shown in solid line in the figure, blocks flow into exhaust duct 20, and in doing so, opens a passage between outlet 12 of the drying chamber and the input end of return duct 21 whose output end leads into pressure chamber 15F. Pressure chamber 15F is provided with an input port which is blocked when an inlet gate 23 is closed, as shown in solid line in FIG. 4. But when inlet gate 23 is open, as shown in dashed line in FIG. 4, it then blocks the output end of gas return duct 21. And when exhaust gate 22 is open, as shown in dashed line, to admit gas discharged from drying chamber 10 into exhaust duct 20, it then blocks gas entry into the input end of return duct 21.

Thus in the recirculating mode, which is the mode that is in effect when gates 22 and 23 are in their solid line positions, as shown in FIG. 4, the heated gas discharged from drying chamber 10 is returned to pressure chamber 15F and recirculated through the system, thereby conserving thermal energy. In practice, heater assembly 18 may be thermostatically-controlled to maintain the gas at a desired, substantially constant, high-temperature level.

But because in the recirculating mode the vapor content of the recirculated gas increases in the course of the drying operation, it is necessary from time to time to purge the vapor-laden gas and to thereafter resume operation with a fresh supply of relatively dry gas. To do this, the gates are switched to the positions shown in dashed line to put the system in the "flow-through mode" in which ambient air is drawn into pressure chamber 15F, and heated therein, vapor-laden air discharged from drying chamber 10 being exhausted into the atmosphere through exhaust duct 20.

Fifth Embodiment

In the embodiment shown in FIG. 4, there is a build-up of vapor content in the recirculating mode of the system.

In order to substantially reduce this build-up, the system shown in FIG. 5 further includes a desiccant bed 24 which is installed in return duct 21 so as to extract vapor from the vapor-laden gas discharged from outlet 12 of the drying chamber into the gas inlet to pressure chamber 15F, thereby making it possible to operate the system in the recirculating mode for a longer period before the need arises to purge the gas.

In this embodiment, an additional gate 25 is provided. When gate 25 is closed, as shown in solid line in FIG. 5, the output end of return duct 21 is coupled to the gas inlet of pressure chamber 15F so that the hot gas passing through this duct is fed back into the inlet of the pressure chamber for recirculation.

But when gate 25 is open, as indicated in dashed line, then the output end of duct 21 is exposed to the atmosphere, and gas passing through desiccant bed 24 is discharged into the atmosphere. Gate 25 therefore makes possible a "dry-out" mode so that when the desiccant bed is saturated with moisture, it can be dried out by passing heated air through the desiccant bed to withdraw moisture therefrom.

Modifications

While there has been shown and described preferred embodiments of a laminar flow system for drying parts in accordance with the invention, it will be appreciated that many changes and modifications may be made therein without, however, departing from the essential spirit thereof. Thus while in the embodiment illustrated the gas is shown entering the lower end of the drying chamber and being exhausted through the open top of the chamber, in practice the system may be configured so that gas enters at the top and through one of the sides.

In practice, baffle 14 shown in the figures serves as a lid for the drying chamber. This lid is first raised in order to permit pieces to be dried to be admitted to the work zone and then partially closed to permit the discharge of moist gas from the chamber.

Another embodiment of the invention which is not illustrated operates in a manner similar to the recirculating system shown in FIG. 4, except that moisture is carried away by a continuous bleed-off rather than by periodic purging. This is especially useful with nitrogen gas drying where during the drying cycle, a modest, continuous flow of fresh nitrogen is injected from the supply line into the system while at the same time, a higher level of flow recirculation is taking place. Small openings at the top or under the lid of the drying chamber permit a bleed-off of moisture-laden nitrogen at about the same escape rate as the amount of dry nitrogen that is being continuously injected from the nitrogen supply line.

By adjusting this bleed-off rate, the net humidity level of the work zone environment can be maintained as desired for an adequate drying effectiveness. This bleed-off technique may also be used with compressed air or even with room air.

One can also remove moisture from the recirculated air or nitrogen in the parts drying system in accordance with the invention by means of a condenser using forced air or a liquid coolant. The disadvantage of this condenser arrangement is that the heat removed from the recirculated gas is thrown away. It is therefore advantageous for purposes of removing the moisture from the recirculated gas to use a heat pump; that is, a refrigeration compressor in a configuration which makes use of the thermal energy drawn from the recirculated gas to bring the same gas back up to the desired operating temperature after the moisture has been removed therefrom.

I claim:

1. A system for drying parts which in the course of their processing are rendered wet with a solvent or other liquid which if not removed will impair the quality of the parts, said system comprising:
   (a) an open-ended drying chamber having a generally rectangular cross section, one rectangular end thereof defining a gas inlet and the other end a gas outlet;
   (b) a work zone disposed within the chamber intermediate the side walls thereof for supporting the parts to be dried;
   (c) a pressure chamber coupled to said gas inlet of the drying chamber and provided with a gas input port;
   (d) a low-pressure drop, box-like submicron particle filter unit of the Hepa type provided with an accordion-folded continuous sheet of non-woven fibers having high strength, said unit having an entry face and an exit face and being disposed in said pressure chamber with its exit face fully covering the rectangular gas inlet to the drying chamber; and
   (e) means to feed a gas at a relatively low pressure appropriate to the low-pressure drop of the filter unit into the input port of the pressure chamber and to elevate the temperature of the gas to a level promoting rapid evaporation of said liquid, said filter unit being capable of operating at said elevated temperature, said gas filling the pressure chamber and exerting a substantially uniform, distributed pressure on the entry face of the unit whereby the gas at an elevated temperature emerges as a laminar stream from the exit face of the unit and flows from the inlet to the outlet of the drying chamber to effect substantially uniform drying of the parts in the work zone.

2. A system as set forth in claim 1, wherein said gas is ambient air.

3. A system as set forth in claim 1, wherein said gas is nitrogen.

4. A system as set forth in claim 1, wherein the structure of said filter unit is formed of materials capable of withstanding an elevated temperature well in excess of 250° F.

5. A system as set forth in claim 4, wherein said heater assembly is formed of electrical resistance elements and is interposed in said pressure chamber between said input port and said filter unit.

6. A system as set forth in claim 5, further including an low-pressure air blower interposed in said pressure chamber between said heater assembly and said input port to draw ambient air into the pressure chamber through the input port.

7. A system as set forth in claim 6, further including a return duct including moisture-removing means having an input and an output end, an exhaust duct, and gate means which in a flow-through mode of system acts to couple the outlet of the drying chamber to said exhaust duct and to decouple the return duct from the system, and in a recirculating mode, acts to decouple the exhaust duct from the system and to couple the input end of the return duct to the outlet and to couple the output end of the return duct to the pressure chamber whereby the gas is recirculated through the system and is not then exhausted.

8. A system as set forth in claim 7, further including a desiccant bed disposed in said return duct to extract moisture form the gas passing therethrough.

9. A system as set forth in claim 8, further including a gate which in one position couples the output end of the return duct to the atmosphere and in another position couples the output end to the pressure chamber.

* * * * *